(12) United States Patent
Shieh et al.

(10) Patent No.: US 6,499,648 B2
(45) Date of Patent: Dec. 31, 2002

(54) METHOD AND DEVICE FOR MAKING A METAL BUMP WITH AN INCREASED HEIGHT

(75) Inventors: Wen-Lo Shieh, Taipei (TW); Ning Huang, Taipei (TW); Hui-Pin Chen, Taipei (TW); Hua-Wen Chiang, Taipei (TW); Chung-Ming Chang, Taipei (TW); Feng-Chang Tu, Taipei (TW); Fu-Yu Huang, Taipei (TW); Hsuan-Jui Chang, Taipei (TW); Chia-Chieh Hu, Taipei (TW); Wen-Long Leu, Taipei (TW)

(73) Assignee: Orient Semiconductor Electronics Limited, Kaohsiung (TW)

( * ) Notice: Subject to any disclaimer, the term of this patent is extended or adjusted under 35 U.S.C. 154(b) by 0 days.

(21) Appl. No.: 09/988,097

(22) Filed: Nov. 19, 2001

(65) Prior Publication Data

US 2002/0179686 A1 Dec. 5, 2002

(30) Foreign Application Priority Data

May 31, 2001 (TW) ........................................ 90113434 A

(51) Int. Cl.⁷ ............................. B23K 31/02; B23K 1/06
(52) U.S. Cl. ...................... 228/110.1; 228/1.1; 228/4.5; 228/180.5
(58) Field of Search ............................. 228/4.5, 180.5, 228/1.1, 110.1; 156/73.1, 73.2

(56) References Cited

U.S. PATENT DOCUMENTS

| | | | |
|---|---|---|---|
| 4,415,115 A | * | 11/1983 | James |
| 4,886,200 A | * | 12/1989 | Tsumura |
| 4,974,767 A | * | 12/1990 | Alfaro et al. |
| 5,871,141 A | * | 2/1999 | Hadar et al. |
| 5,938,105 A | * | 8/1999 | Singh |
| 6,065,667 A | * | 5/2000 | Singh |
| 6,158,647 A | * | 12/2000 | Chapman et al. |
| 6,213,378 B1 | * | 4/2001 | Singh |
| 6,260,753 B1 | * | 7/2001 | Renard et al. |

FOREIGN PATENT DOCUMENTS

| | | | |
|---|---|---|---|
| JP | 355088345 A | * | 7/1980 |
| JP | 03027544 A | * | 12/1991 |

* cited by examiner

Primary Examiner—Tom Dunn
Assistant Examiner—Kiley Stoner
(74) Attorney, Agent, or Firm—Leong C. Lei

(57) ABSTRACT

A device for making metal bumps includes a hard conical tubular member having a vertical conical passage at an upper portion thereof, a bell shaped chamber at a lower portion thereof which is larger than the vertical conical passage in diameter, located under and communicated with the vertical conical passage, and a circular recess which is larger than the bell shaped chamber in diameter, located under and communicated with the bell shaped chamber, thereby forming a capillary tube with a surface.

1 Claim, 3 Drawing Sheets

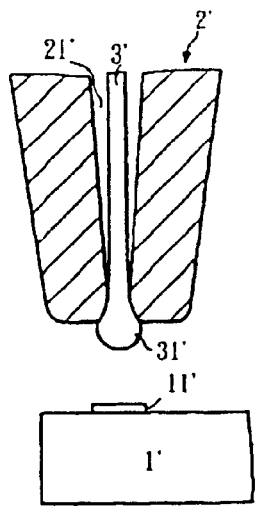
PRIOR ART
FIG. 1A
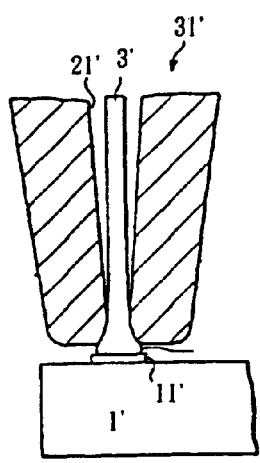
PRIOR ART
FIG. 1B
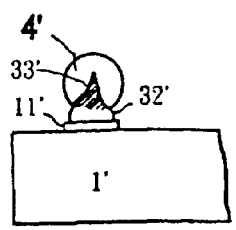 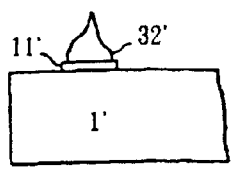
PRIOR ART         PRIOR ART
FIG. 1D           FIG. 1C

METHOD AND DEVICE FOR MAKING A METAL BUMP WITH AN INCREASED HEIGHT

BACKGROUND OF THE INVENTION

1. Field of the Invention

This invention is related to a method and device for making a metal bump with an increased height and in particular to one which can increase the connection reliability between the metal bump and the chip and enlarging the contact area between the metal bump and the metal or solder ball.

2. Description of the Prior Art

Various kinds of methods of making metal bumps on a chip have been developed for flip chip on board (FCOB) technology with a small number of input pins or a small number of Input/Output pins or for flip chip in package (FCIP) with a large number of Input/Output pins, such as evaporation plating, splash plating, electroplating, printing, spraying, and bonding. However, the capillary tube 2' is still the most commonly used tool for making metal stud bumps by means of wire bonding (see FIG. 1A). As shown, the capillary tube 2' has an inner diameter 21' with an inner wall 22' and has a larger diameter at the upper end than the lower end. A metal wire 3' is inserted into the capillary tube 2' and the lower end of the metal wire 3' is melted to form a ball shaped member 31' by electric spark. Then, ultrasonic vibration and pressure deformation processing are applied to the capillary tube 2' to join the inter-metallic compounds between wire 3' and the chip 1' (see FIG. 1B). When the capillary tube 2' is removed, a metal bump 32' will be formed on the raised platform 11' of the chip 1' (see FIG. 1C). Thereafter; a metal or solder ball 4' is soldered on the metal bump 32'.

However, due to the limitation of the design of the capillary tube 2', the metal bump 32' will have a spherical surface which is insufficient to provide a large contact area and a reliable structure for joining other component parts. Furthermore, the bottom of the metal bump 32' will tend to go beyond the lower opening of the capillary tube 2' under pressure thereby making it difficult to control. Moreover; as the metal bump 32' has a spherical surface, there will not be sufficient area in contact with a metal or solder ball 4' (see FIG. 1D). In addition, the metal bump 32' is so short that the metal or solder ball 4' must be soldered to the metal bump 32' at a very low position thereby making it difficult to make the connection between the die and the fingers of a substrate (or lead frame, chips, metal bumps or the like) and therefore influencing the qualification rate of products.

Therefore, it is an object of the present invention to provide a method and device for making a metal bump with an increased height which can obviate and mitigate the above-mentioned drawbacks.

SUMMARY OF THE INVENTION

This invention is related to a method and device for making a metal bump with an increased height.

It is the primary object of the present invention to provide a method and device for making metal bumps with an increased height which can increase the joining strength with other metal bumps or pads of a die.

It is another object of the present invention to provide a method and device for making metal bumps with an increased height which can enlarge the contact area with the metal or solder ball.

It is still another object of the present invention to provide a method and device for making metal bumps with an increased height which can increase its reliability in joining with other component parts.

It is a further object of the present invention to provide a method and device for making metal bumps which have an increased height but are small in diameter.

The foregoing object and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

BRIEF DESCRIPTION OF THE DRAWINGS

FIG. 1A illustrates the lower end of the metal wire being melted to form a ball shaped member according to the prior art;

FIG. 1B illustrates the connection between the ball shaped member and the die according to the prior art;

FIG. 1C illustrates a metal bump according to the prior art;

FIG. 1D illustrates the connection between the metal bump and the metal or solder ball;

DETAILED DESCRIPTION OF THE PREFERRED EMBODIMENT

Figure 2:
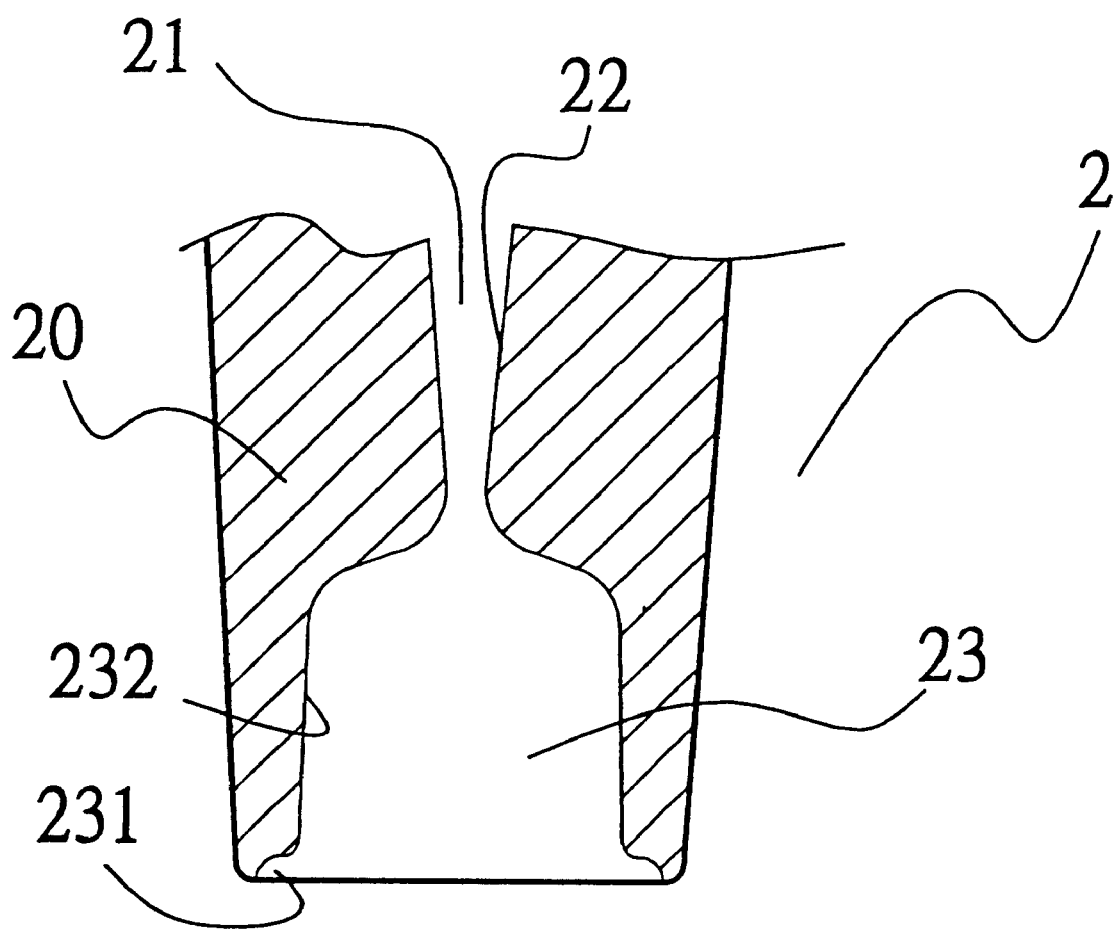
FIG. 2 is a sectional view of the capillary tube according to the present invention.
Figure 3A:
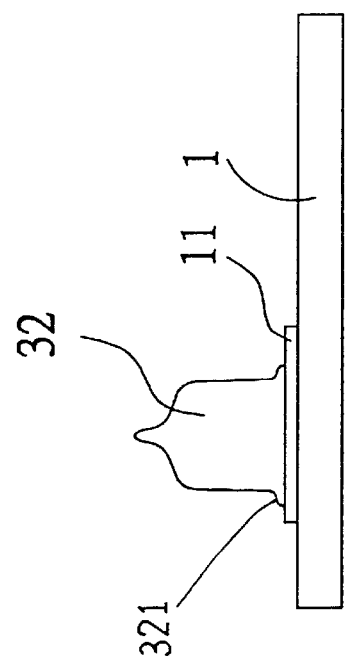
FIG. 3A illustrates how the lower end of the metal wire is melted to form a ball shaped member according to the present invention.
Figure 3B:
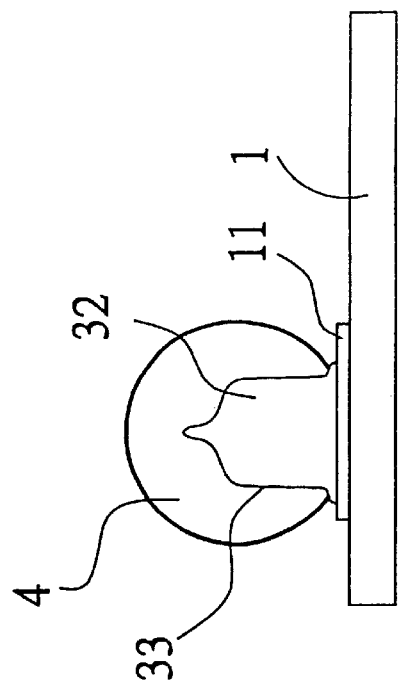
FIG. 3B illustrates how the lower end of the metal wire is joined with the die according to the present invention.
Figure 3C:
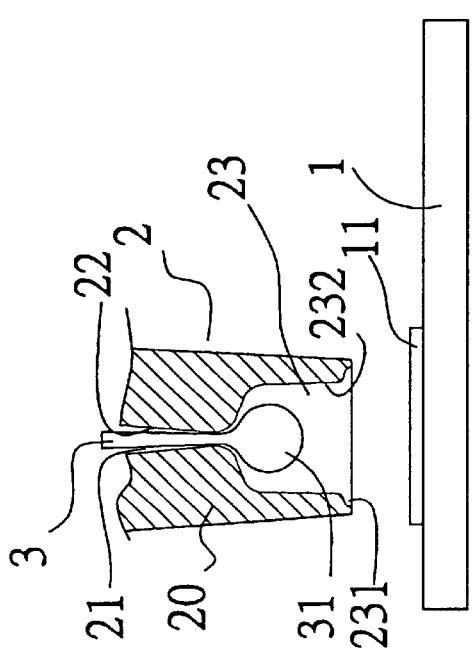
FIG. 3C illustrates the metal bump according to the present invention.
Figure 3D:
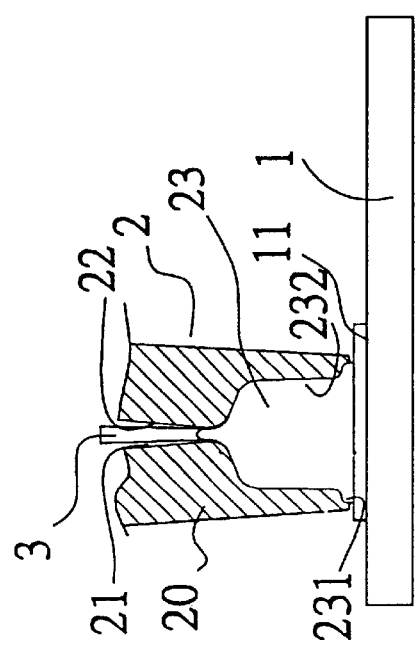
FIG. 3D illustrates the connection between the metal bump and the metal or solder ball according to the present invention.

For the purpose of promoting an understanding of the principles of the invention, reference will now be made to the embodiment illustrated in the drawings. Specific language will be used to describe same. It will, nevertheless, be understood that no limitation of the scope of the invention is thereby intended, alterations and further modifications in the illustrated device, and further applications of the principles of the invention as illustrated herein being contemplated as would normally occur to one skilled in the art to which the invention relates.

Referring to the drawings and in particular to FIG. 2 thereof, the high metal bump according to the present invention is manufactured by a hard conical tubular member 20 having a vertical conical passage 21 at the upper portion, a bell shaped chamber 23 at the lower portion which is larger than the vertical conical passage 21 in diameter, and which is located under and communicated with the vertical conical passage 21, and a circular recess 231 which is larger than the bell shaped chamber 23 in diameter, and which is located under and communicated with the bell shaped chamber 23, thereby forming a capillary tube 2 with a surface 22.

During manufacture, a metal wire 3 is inserted into the conical passage 21 of the hard conical tubular member 20, with its lower end protruded down into the bell shaped chamber 23. Then, the lower end of the metal wire 3 is melted to form a ball 31. Then, the hard conical tubular member 2 is approached to a raised platform 11 formed on the top of a chip 1, and the metal wire 3 is heated and bonded on the pad of die to melt and ultrasonic energy is applied to make the melted metal fill up the bell shaped chamber 23, thereby forming a metal bump 32 on the platform 11. Thereafter, the hard conical tubular member 2 is removed to pull off the necking position between the metal wire 3 and the top of the metal bump 32 thereby leaving the metal bump 32 on the platform 11. The bottom of the metal bump 32 has a flange 321 formed by the circular recess 231 of the hard conical tubular member 2.

Because of the vertical conical passage 21, the bell shaped chamber 23 and the circular recess 231, the cross sectional area of the metal bump 32 will be restricted by the bottom area of the bell shaped chamber 23 and the metal bump 32 will have a height equal to the height 232 of the bell shaped chamber 23 thereby increasing the joining capability between the metal bump 32 and the raised platform 11 of the semiconductor chip 1 and enlarging the contact area 33 between the metal bump 32 and the metal or solder ball 4.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

We claim:

1. A method of making metal bumps comprising the steps of:
   inserting a metal wire into a conical passage of a hard conical tubular member with a lower end protruded down into a bell shaped chamber;
   melting said lower end of said metal wire to form a ball shaped member;
   approaching said hard conical tubular member to a raised platform formed on a top of a die;
   melting said metal wire and applying ultrasonic energy to make melted metal fill up said bell shaped chamber and a circular recess thereby forming a metal bump on said raised platform; and
   removing said hard conical tubular member to pull off a necking position between said metal wire and a top of said metal bump thereby leaving a metal bump on said raised platform, a bottom of said metal bump having a flange formed by said circular recess of said hard conical tubular member.

* * * * *